(12) United States Patent
Ishibashi

(10) Patent No.: US 9,640,384 B2
(45) Date of Patent: May 2, 2017

(54) SUBSTRATE CLEANING APPARATUS AND SUBSTRATE CLEANING METHOD

(71) Applicant: EBARA CORPORATION, Tokyo (JP)

(72) Inventor: Tomoatsu Ishibashi, Tokyo (JP)

(73) Assignee: Ebara Corporation, Tokyo (JP)

( * ) Notice: Subject to any disclaimer, the term of this patent is extended or adjusted under 35 U.S.C. 154(b) by 476 days.

(21) Appl. No.: 14/139,746

(22) Filed: Dec. 23, 2013

(65) Prior Publication Data

US 2014/0182628 A1 Jul. 3, 2014

(30) Foreign Application Priority Data

Dec. 28, 2012 (JP) ................................ 2012-287120

(51) Int. Cl.
*B08B 3/04* (2006.01)
*H01L 21/02* (2006.01)
*H01L 21/67* (2006.01)

(52) U.S. Cl.
CPC .. *H01L 21/02057* (2013.01); *H01L 21/67051* (2013.01)

(58) Field of Classification Search
None
See application file for complete search history.

(56) References Cited

U.S. PATENT DOCUMENTS

| | | | | |
|---|---|---|---|---|
| 6,050,275 A | * | 4/2000 | Kamikawa | B08B 3/08 134/102.3 |
| 6,325,081 B1 | * | 12/2001 | Miki | B08B 3/02 134/100.1 |
| 2003/0168078 A1 | * | 9/2003 | Deguchi | B08B 3/02 134/1.3 |
| 2007/0295365 A1 | * | 12/2007 | Miya | H01L 21/02057 134/26 |
| 2008/0135070 A1 | * | 6/2008 | Lu | B05B 7/0861 134/103.2 |

FOREIGN PATENT DOCUMENTS

| | | |
|---|---|---|
| JP | 08-064514 A | 3/1996 |
| JP | 10-308374 | 11/1998 |
| JP | 2007-294822 A | 11/2007 |
| JP | 2011-077135 A | 4/2011 |

\* cited by examiner

*Primary Examiner* — Michael Kornakov
*Assistant Examiner* — Ryan Coleman
(74) *Attorney, Agent, or Firm* — Baker & Hostetler LLP

(57) ABSTRACT

A substrate cleaning apparatus includes: a substrate holder configured to hold and rotate a substrate; an ultrasonic cleaning unit configured to impart an ultrasonic vibration energy to deaerated pure water and then supply the deaerated pure water onto a surface of the substrate; a pure water spray nozzle configured to spray deaerated pure water onto the surface of the substrate; a chamber surrounding the substrate holder and the pure water spray nozzle; and an inert gas supply line configured to supply an inert gas into the chamber.

4 Claims, 7 Drawing Sheets

SUBSTRATE CLEANING APPARATUS AND SUBSTRATE CLEANING METHOD

CROSS REFERENCE TO RELATED APPLICATION

This application claims priority to Japanese Patent Application No. 2012-287120 filed Dec. 28, 2012, the entire contents of which are hereby incorporated by reference.

BACKGROUND OF THE INVENTION

Field of the Invention

The present invention relates to a substrate cleaning apparatus and a substrate cleaning method, and more particularly to a substrate cleaning apparatus and a substrate cleaning method for cleaning a surface of a substrate, such as a wafer, in a non-contact manner with use of an ultrasonic cleaning process. The substrate cleaning apparatus and the substrate cleaning method according to the present invention can be applied not only to cleaning of a wafer having a diameter of 300 mm, but also to cleaning of a wafer having a diameter of 450 mm, and can further be applied to a manufacturing process of a flat panel, a manufacturing process of an image sensor such as CMOS and CCD, a manufacturing process of a magnetic film for MRAM, and the like.

Description of the Related Art

As semiconductor devices are becoming finer in recent years, various films, made of materials having different physical properties, are formed on a substrate and are processed. In particular, in a damascene process for forming interconnects by filling a metal into interconnect trenches formed in an insulating film, an excessive metal on the substrate surface is polished and removed away by a substrate polishing apparatus after the formation of metal interconnects. Various types of films, such as a metal film, a bather film, and an insulating film, having different wettabilities with water, are exposed on the substrate surface after CMP.

Particles (or defects), such as a residue of slurry (slurry residue) that has been used in CMP, and metal polishing debris exist on the substrate surface that has been polished by CMP. If cleaning of the substrate surface is insufficient and as a result the residues remain on the substrate surface, the residues on the substrate surface may cause reliability problems, such as current leak from a residue portion where the particles remain, and may cause poor adhesion. It is therefore necessary to clean the substrate surface to a high cleanliness level, on which a plurality of films, such as a metal film, a barrier film, and an insulating film, having different wettabilities with water are exposed.

One of known methods of cleaning a surface of a substrate, such as a wafer, in a noncontact manner is an ultrasonic cleaning method in which pure water, which has been subjected to an ultrasonic treatment, is ejected to the substrate to thereby clean the surface of the substrate by the action of cavitation. The pure water used in this ultrasonic cleaning method is deaerated pure water (cleaning liquid) supplied from a factory into the polishing apparatus.

The deaerated pure water (cleaning liquid) supplied from the factory into the polishing apparatus contains very little gas therein. For example, a concentration of dissolved oxygen in the deaerated pure water (i.e., DO value) is typically at most 20 ppb, and may be even controlled to at most 5 ppb. Fabrication of state-of-the-art devices may require use of the pure water having a dissolved-oxygen concentration of 1 ppb.

The ultrasonic cleaning process utilizing the cavitation is a physical cleaning process that uses a gas-containing liquid to which ultrasonic wave is applied. An example of a specific condition of the dissolved gas required for the liquid to be supplied to an ultrasonic cleaning unit is that "the concentration of the dissolved gas in the liquid is in a range of 1 ppm to 15 ppm". It is also known that, if an excessive amount of gas is dissolved in the liquid for use in the ultrasonic cleaning process, sufficient cleaning properties cannot be obtained.

However, as described above, when the deaerated pure water with the DO value of at most 20 ppb is used in the ultrasonic cleaning process, sufficient cleaning properties cannot be obtained because the pure water contains very little dissolved gas. Accordingly, in the cleaning process (e.g., the substrate cleaning process performed after CMP) that is conducted under particle contamination due to a polishing liquid, the use of the deaerated pure water may prevent the ultrasonic cleaning process from achieving full advantages of its cleaning effect.

In particular, a size of a silicon wafer is expected to shift from a diameter of 300 mm to a diameter of 450 mm. In this trend, it may be more difficult to highly clean the entire surface of the substrate, such as a silicon wafer, having a diameter of 450 mm.

One solution to achieving the proper cleaning effect of the ultrasonic cleaning process is to dissolve the gas in the deaerated pure water to be supplied into the apparatus. However, in order to realize this solution, it is necessary to provide an additional unit for dissolving the gas in the deaerated pure water and a controlling device of such a unit, thus making the apparatus complicated and large and increasing costs.

SUMMARY OF THE INVENTION

The present invention has been made in view of the foregoing issues. It is therefore an object of the present invention to provide a substrate cleaning apparatus and a substrate cleaning method capable of performing an ultrasonic cleaning process under an optimal condition that can fully achieve a proper cleaning effect of the ultrasonic cleaning process with a relatively simple structure.

One embodiment is a substrate cleaning apparatus, comprising: a substrate holder configured to hold and rotate a substrate; an ultrasonic cleaning unit configured to impart an ultrasonic vibration energy to deaerated pure water and then supply the deaerated pure water onto a surface of the substrate; a pure water spray nozzle configured to spray deaerated pure water onto the surface of the substrate; a chamber surrounding the substrate holder and the pure water spray nozzle; and an inert gas supply line configured to supply an inert gas into the chamber.

Another embodiment is a substrate cleaning apparatus, comprising: a substrate holder configured to hold and rotate a substrate; a first pure water supply line and a second pure water supply line configured to supply deaerated pure water; an ultrasonic cleaning unit configured to impart an ultrasonic vibration energy to the deaerated pure water, which is supplied from the first pure water supply line, and then supply the deaerated pure water onto a surface of the substrate; a pure water supply nozzle configured to supply the deaerated pure water, which is supplied from the second pure water supply line, onto the surface of the substrate; and a gas dissolving unit configured to dissolve a gas in the deaerated pure water flowing through the second pure water supply line.

Another embodiment is a substrate cleaning method, comprising: holding and rotating a substrate; imparting an ultrasonic vibration energy to deaerated pure water and then supplying the deaerated pure water onto a surface of the substrate to form a film of the deaerated pure water on the surface of the substrate; spraying deaerated pure water toward an inert gas atmosphere; and supplying the deaerated pure water that has passed through the inert gas atmosphere onto the film of the deaerated pure water.

Another embodiment is a substrate cleaning method, comprising: holding and rotating a substrate horizontally; imparting an ultrasonic vibration energy to deaerated pure water and then supplying the deaerated pure water onto a surface of the substrate to form a film of the deaerated pure water on the surface of the substrate; passing deaerated pure water through a gas dissolving unit to dissolve an inert gas in the deaerated pure water; and supplying the deaerated pure water containing the inert gas onto the film of the deaerated pure water.

The ultrasonic cleaning unit imparts the ultrasonic vibration energy to the deaerated pure water having little dissolved gas therein, and then supplies the pure water onto the surface of the substrate which is an object to be cleaned. Thereafter, the concentration of dissolved gas in the film of the ultrasonic pure water formed on the surface of the substrate is increased. Accordingly, the ultrasonic cleaning of the surface of the substrate can be performed with a relatively simple structure under an optimal condition that can fully achieve the same cleaning effect as that of an ultrasonic cleaning process that applies an ultrasonic wave to a liquid containing gas dissolved therein.

DETAILED DESCRIPTION

Embodiments will be described below with reference to the drawings.

Figure 1:
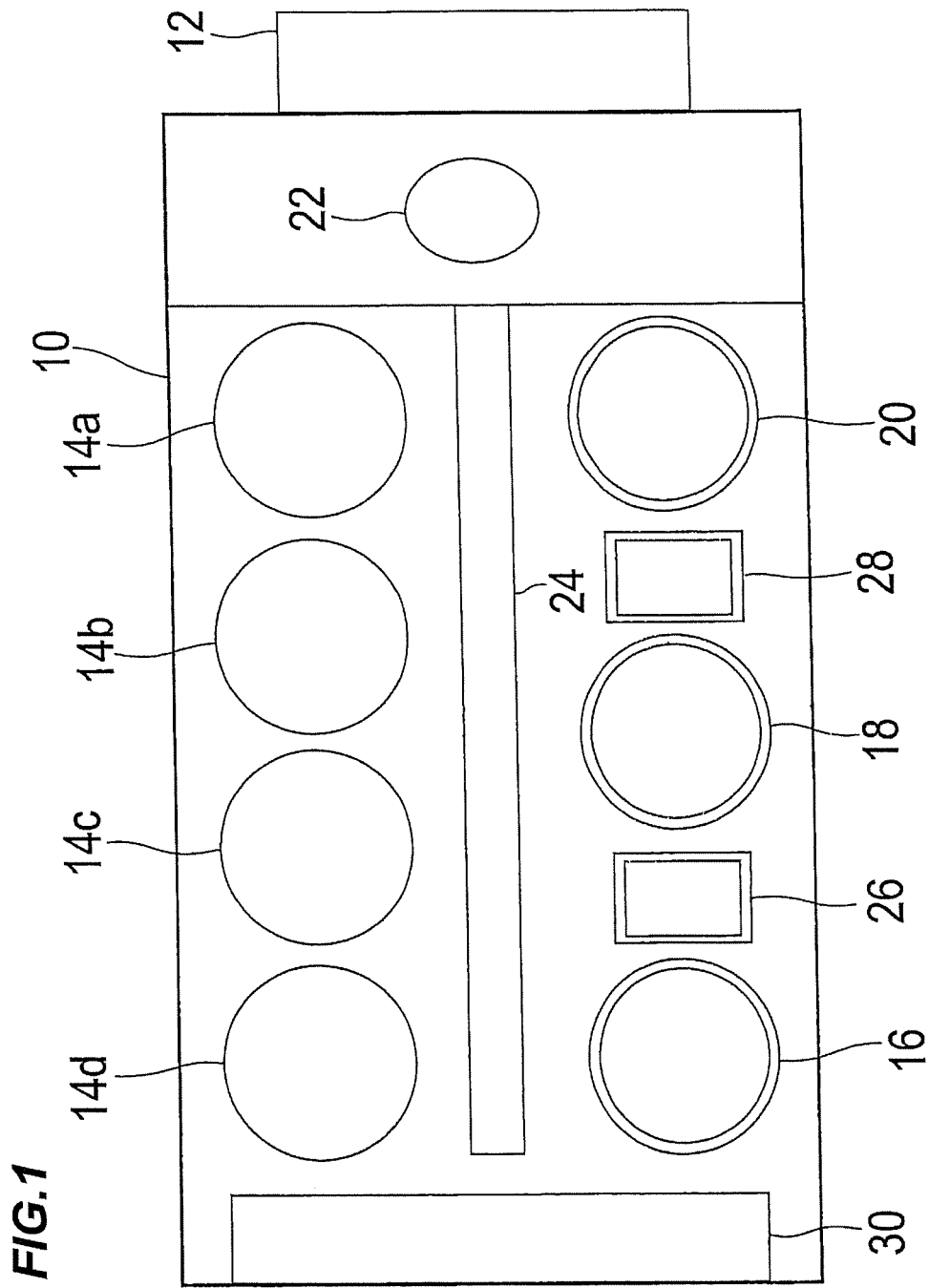
FIG. 1 is a plan view showing an entire structure of a substrate processing apparatus incorporating a substrate cleaning apparatus according to an embodiment.

FIG. 1 is a plan view showing an entire structure of a substrate processing apparatus incorporating a substrate cleaning apparatus according to an embodiment. As shown in FIG. 1, the substrate processing apparatus includes an approximately rectangular housing 10, and a loading port 12 for receiving thereon a substrate cassette storing a plurality of substrates, such as wafers, therein. The loading port 12 is disposed adjacent to the housing 10 and is capable of receiving thereon an open cassette, a SMIF (standard manufacturing interface) pod or a FOUP (front opening unified pod). Each of the SMIF and the FOUP is a hermetically sealed container which houses therein a substrate cassette and is covered with a partition wall, and thus can keep independent internal environment isolated from an external space.

In the housing 10, there are provided a plurality of (four in this embodiment) polishing units 14a, 14b, 14c, and 14d each for polishing a substrate, a first cleaning unit 16 and a second cleaning unit 18 each for cleaning the polished substrate, and a drying unit 20 for drying the cleaned substrate. The polishing units 14a, 14b, 14c, and 14d are arranged along the longitudinal direction of the substrate processing apparatus, and the cleaning units 16, 18 and the drying unit 20 are also arranged along the longitudinal direction of the substrate processing apparatus. The substrate cleaning apparatus according to the embodiment is applied to the second cleaning unit 18.

A first transfer robot 22 is disposed in an area surrounded by the loading port 12, the polishing unit 14a, and the drying unit 20. A transporting unit 24 is arranged in parallel to the polishing units 14a, 14b, 14c, and 14d. The first transfer robot 22 receives a substrate, to be polished, from the loading port 12 and transports the substrate to the transporting unit 24, and receives a dried substrate from the drying unit 20 and returns the dried substrate to the loading port 12. The transporting unit 24 receives a substrate from the first transfer robot 22, and transports the substrate between the polishing units 14a, 14b, 14c, and 14d.

A second transfer robot 26 for transferring a substrate between the first cleaning unit 16 and the second cleaning unit 18 is provided between these units 16, 18. A third transfer robot 28 for transferring a substrate between the second cleaning unit 18 and the drying unit 20 is provided between these units 18, 20. A controller 30 for controlling operations of the units of the substrate processing apparatus is provided in the housing 10.

In this embodiment, a roll-type cleaning unit is used as the first cleaning unit 16. This roll-type cleaning unit is configured to bring a horizontally-extending cylindrical roll cleaning member into contact with a front surface (and a rear surface) of the substrate in the presence of a cleaning liquid while rotating both the substrate and the roll cleaning member in one direction to thereby scrub the front surface (and the rear surface) of the substrate. The first cleaning unit (roll-type cleaning unit) 16 is further configured to perform, in addition to the scrub cleaning, megasonic cleaning which applies an ultrasonic wave, having a frequency in a range of several tens to 5 MHz, to the cleaning liquid and applies an acting force, generated by vibration acceleration of the cleaning liquid, to fine particles attached to the substrate surface.

The substrate cleaning apparatus according to the embodiment is used as the second cleaning unit 18. A spin drying unit in which an IPA vapor is ejected toward a horizontally rotating substrate from a moving jet nozzle to dry the substrate and then the substrate is rotated at a high rotational speed to dry the substrate by a centrifugal force, is used as the drying unit 20.

Figure 2:
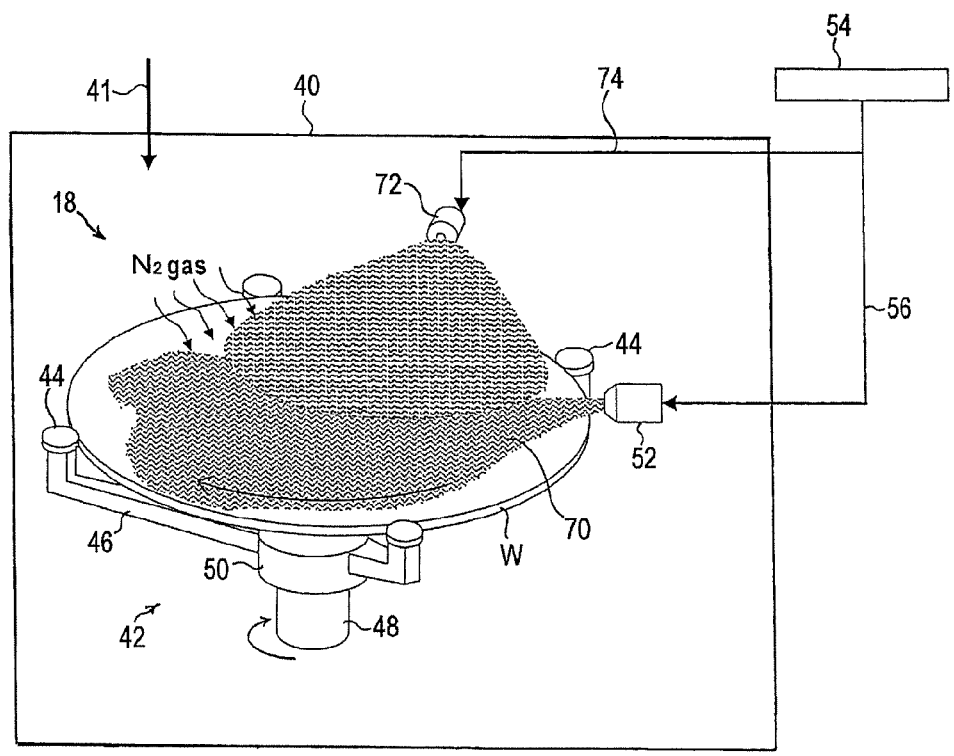
FIG. 2 is a schematic perspective view showing the substrate cleaning apparatus which is used as a second cleaning unit in the substrate processing apparatus shown in FIG. 1.
Figure 3:
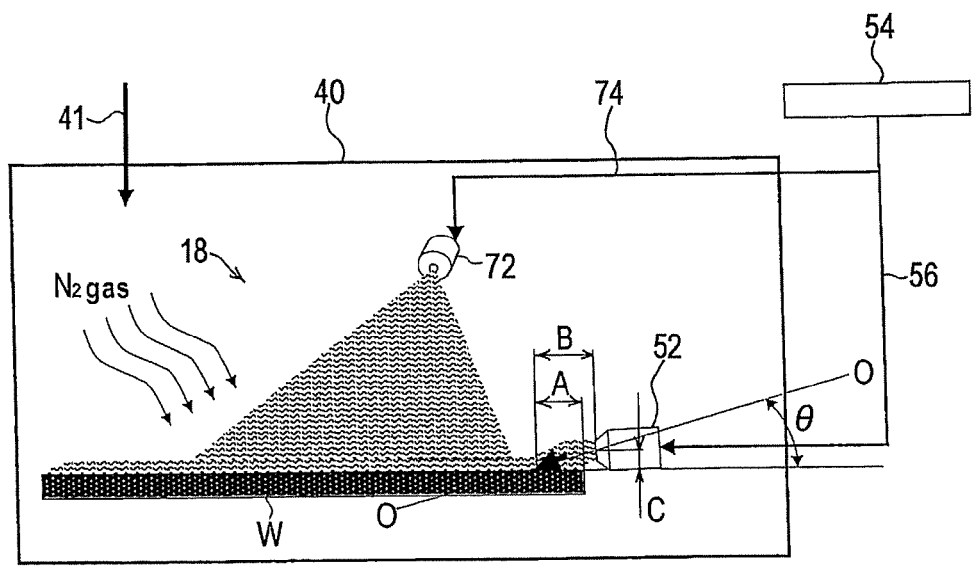
FIG. 3 is a schematic front view showing the second cleaning unit shown in FIG. 2 in which illustration of a substrate holder is omitted.

FIG. 2 is a schematic perspective view showing the embodiment of the substrate cleaning apparatus which is used as the second cleaning unit 18 of the substrate processing apparatus shown in FIG. 1. FIG. 3 is a schematic front view showing the second cleaning unit 18 shown in FIG. 2 in which illustration of a substrate holder is omitted.

As shown in FIG. 2, the second cleaning unit 18, which is one embodiment of the substrate cleaning apparatus, is arranged in a chamber 40 which is configured to be able to replace its interior atmosphere with an inert gas atmosphere, e.g., an $N_2$ gas atmosphere. An inert gas supply line 41 is coupled to the chamber 40 so as to supply an inert gas, such as nitrogen gas, into an interior space of the chamber 40. The second cleaning unit 18 has a substrate holder 42 configured to hold a substrate W, such as a wafer, horizontally and rotate the substrate W. This substrate holder 42 has a plurality of (four in the drawing) arms 46 provided with chucks 44 for holding the substrate W horizontally. The chucks 44 are provided on distal end portions of the arms 46, and base end portions of the arms 46 are coupled to a base 50 which is rotated together with a rotational shaft 48. With these configurations, the substrate W, which is held by the chucks 44 of the substrate holder 42, is rotated horizontally in a direction indicated by arrow.

An ultrasonic cleaning unit 52, pointing at the substrate W, is disposed laterally of and above the substrate W held by the substrate holder 42. This ultrasonic cleaning unit 52 is coupled to a first pure water supply line 56 extending from a pure water supply source 54 to the interior of the substrate processing apparatus. The pure water supply source 54 is installed in a factory and supplies deaerated pure water having a DO value of, e.g., at most 20 ppb.

Figure 4:
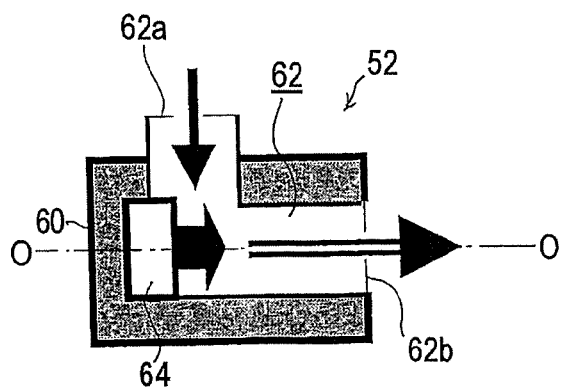
FIG. 4 is a cross-sectional view showing an ultrasonic cleaning unit.

As shown in FIG. 4, the ultrasonic cleaning unit 52 has a piezoelectric element 64 serving as an ultrasonic transducer disposed in a fluid passage 62 formed in a body structure 60. When the piezoelectric element 64 is energized while high-pressure pure water is injected into the fluid passage 62 from an injection aperture 62*a*, an ultrasonic vibration energy is imparted to the pure water, which is then ejected through a jet orifice 62*b* to form a pure water jet in a conical shape around its jet central axis O.

As shown in FIG. 3, the ultrasonic cleaning unit 52 ejects the pure water toward the surface of the substrate W. This ultrasonic cleaning unit 52 is arranged such that an angle θ of the jet central axis O of the ejected pure water with respect to the surface of the substrate W is larger than 0° and not more than 30° (0°<θ≤30°). This arrangement allows the pure water to spread uniformly on the surface of the substrate W to thereby form a uniform ultrasonic pure water film on the surface of the substrate W. The jet central axis O of the pure water represents a traveling direction of the pure water ejected from the ultrasonic cleaning unit 52.

As shown in FIG. 3, the ultrasonic cleaning unit 52 is located such that a distance A from a peripheral edge of the substrate W to a point of intersection of the jet central axis O and the surface of the substrate W is not less than 0 mm and not more than 50 mm (0 mm≤A≤50 mm), and a distance B from the center of the jet orifice 62*b* of the ultrasonic cleaning unit 52 to the point of intersection of the jet central axis O and the surface of the substrate W is about 60 mm (B≈60 mm). Therefore, a distance C between the surface of the substrate W and the center of the jet orifice 62*b* of the ultrasonic cleaning unit 52 is larger than 0 mm and not more than 30 mm (0 mm<C≤30 mm).

The deaerated pure water is supplied through the first pure water supply line 56 to the ultrasonic cleaning unit 52, and is ejected toward the surface of the substrate W which is held and rotated horizontally by the substrate holder 42. Since the ultrasonic cleaning unit 52 imparts the ultrasonic vibration energy to the pure water, an ultrasonic pure water film 70 is formed uniformly on the surface of the substrate W. The rotational speed of the substrate W may be in a range of 50 to 300 $min^{-1}$.

A pure water spray nozzle 72, pointing downwardly, is provided right above the substrate W held by the substrate holder 42. This pure water spray nozzle 72 is coupled to a second pure water supply line 74 extending from the pure water supply source 54 to the interior of the substrate processing apparatus. The pure water is supplied through the second pure water supply line 74 to the pure water spray nozzle 72, which then sprays the pure water onto the surface of the substrate W located below the pure water spray nozzle 72.

The substrate holder 42, the ultrasonic cleaning unit 52, and the pure water spray nozzle 72 are arranged in the chamber 40. When the substrate W is cleaned, the chamber 40 is filled with the inert gas. Specifically, the inert gas is supplied through the inert gas supply line 41 into the chamber 40 to replace the interior atmosphere of the chamber 40 with the inert gas atmosphere, e.g., the $N_2$ gas atmosphere. Further, the ultrasonic pure water film 70 is formed on the surface of the substrate W as described above. In this state, the pure water is sprayed from the pure water spray nozzle 72 onto the ultrasonic pure water film 70. As a result, the pure water, which has been sprayed from the pure water spray nozzle 72 toward the ultrasonic pure water film 70, takes in the inert gas, such as $N_2$ gas. This inert gas, introduced into the pure water, is mixed into the ultrasonic pure water film 70 to thereby increase the concentration of dissolved gas in the ultrasonic pure water film 70 to 1 ppm or more, for example. As a result, the cleaning effect of the ultrasonic cleaning is improved.

The pure water spray nozzle 72 may be a fan-shaped nozzle configured to spray a mist of pure water in a fan shape, or may be a conical-shaped nozzle configured to spray a mist of pure water in a conical shape. A temperature of the pure water, sprayed from the pure water spray nozzle 72, may be controlled to be within a range of 18 to 40° C.

Figure 5:
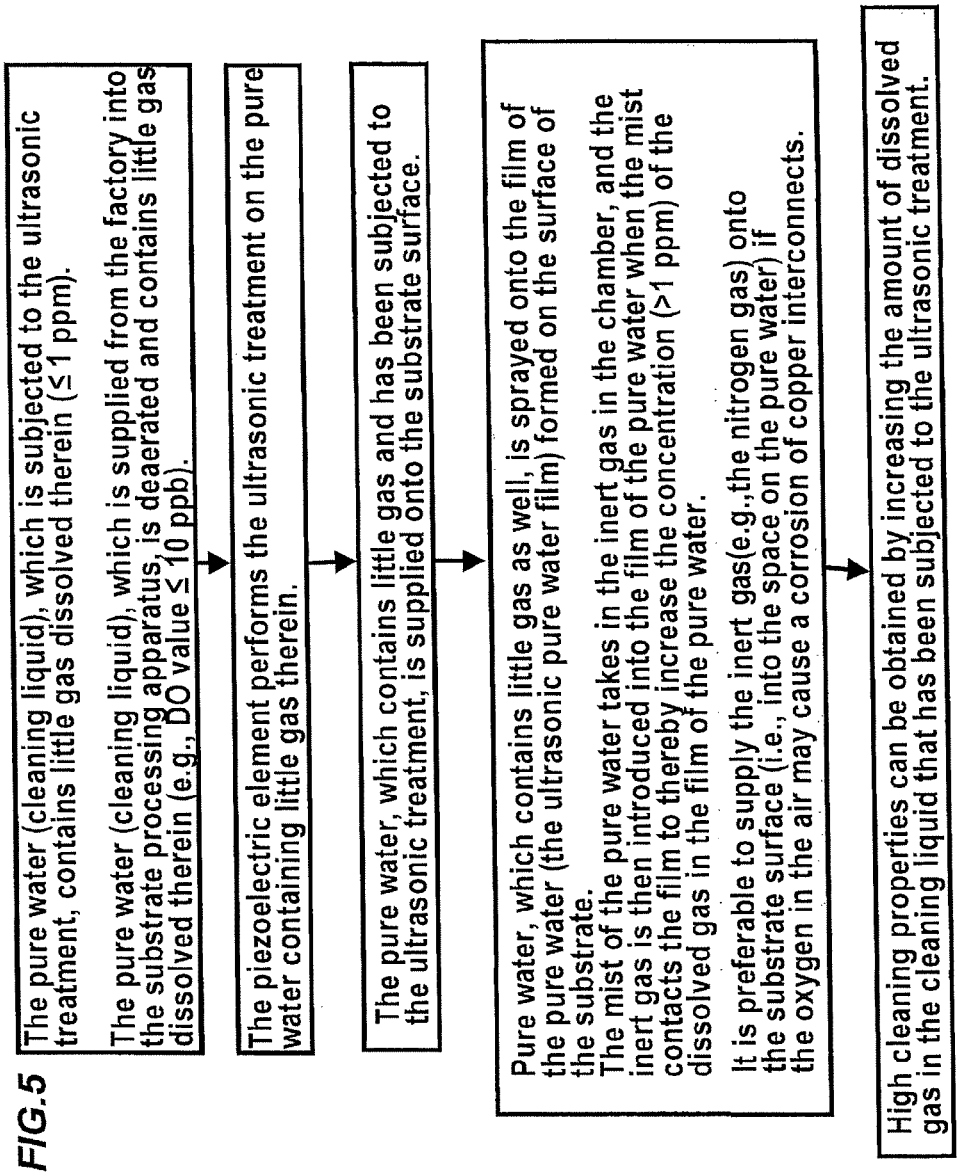
FIG. 5 is a flow diagram showing an example of a cleaning process performed by the second cleaning unit shown in FIG. 2.

Next, an example of the cleaning process of the substrate W performed by the second cleaning unit 18 will be described with reference to FIG. 5. Firstly, the substrate W is held horizontally by the chucks 44 of the substrate holder 42, and the interior atmosphere of the chamber 40 is replaced with the inert gas atmosphere (e.g., the $N_2$ gas atmosphere). Then the substrate W is rotated horizontally. Subsequently, the pure water, to which the ultrasonic vibration energy has been imparted from the ultrasonic cleaning unit 52, is ejected onto the surface of the rotating substrate W to form the ultrasonic pure water film 70 on the surface of the substrate W.

This pure water (i.e., the cleaning liquid), which has been subjected to the ultrasonic treatment, contains little gas dissolved therein. For example, the DO value of this pure water is not more than 1 ppm. That is, the pure water for use in the ultrasonic cleaning and supplied from the factory into the substrate processing apparatus is the deaerated pure water whose concentration of the dissolved gas may be at most 10 ppb which represents the DO value.

The piezoelectric element 64 of the ultrasonic cleaning unit 52 performs the ultrasonic treatment on this pure water containing little dissolved gas. Then the pure water is supplied onto the surface of the substrate W to form the ultrasonic pure water film 70 on the surface of the substrate W.

With the ultrasonic pure water film 70 formed on the surface of the substrate W, the pure water spray nozzle 72 sprays the pure water onto the ultrasonic pure water film 70, so that the concentration of the dissolved gas in the ultrasonic pure water film 70 on the surface of the substrate W is increased. The surface of the substrate W is cleaned with this ultrasonic pure water film 70 having the increased concentration of the dissolved gas. In this manner, the cleaning effect of the ultrasonic cleaning process can be improved.

That is, in order to increase the amount of gas dissolved in the pure water which, after the ultrasonic treatment, has been supplied to the surface of the substrate W with little dissolved gas, the pure water spray nozzle 72 sprays the pure water, which does not contain the dissolved gas as well, onto the ultrasonic pure water film 70 that is formed by the pure water on the surface of the substrate W.

The inert gas, such as the $N_2$ gas, existing in the chamber 40, is dissolved in the mist of the pure water that has been sprayed from the pure water spray nozzle 72. When the mist of the pure water contacts the ultrasonic pure water film 70, the inert gas contained in the mist is introduced into the ultrasonic pure water film 70, so that the concentration of the dissolved gas in the ultrasonic pure water film 70 is increased to more than 1 ppm, for example.

If pure water containing oxygen is supplied onto surfaces of copper interconnects, the copper surface is easily oxidized, thus changing their properties. As a result, a device performance may be lowered. In order to prevent such a drawback, in this embodiment, the inert gas atmosphere is formed in the chamber 40 so that the pure water takes in this inert gas, such as the nitrogen gas.

In this embodiment, the pure water that has been subjected to the ultrasonic treatment is supplied onto the surface of the substrate W, and then the concentration of the dissolved gas in the pure water on the surface of the substrate W is increased. As a result, a high cleaning effect can be obtained.

In the substrate processing apparatus shown in FIG. 1, the substrate is removed from the substrate cassette in the loading port 12 and is transferred to one of the polishing units 14a, 14b, 14c, 14d, where the surface of the substrate is polished. The surface of the substrate, which has been polished, is roughly cleaned in the first cleaning unit (roll-type cleaning unit) 16, and is then finish-cleaned in the second cleaning unit (substrate cleaning apparatus) 18. Then, the cleaned substrate is removed from the second cleaning unit 18 and transferred to the drying unit 20, where the substrate is spin-dried. Thereafter, the dried substrate is returned into the substrate cassette on the loading port 12.

Although the inert gas atmosphere (e.g., the nitrogen gas atmosphere) is formed in the chamber 40, if the oxygen does not affect the cleaning of the substrate, the air in the chamber 40 may not be replaced with the inert gas atmosphere and the cleaning of the substrate may be performed with the air existing in the chamber 40. In this case, the pure water, sprayed from the pure water spray nozzle 72 toward the ultrasonic pure water film 70, takes in the air (i.e., the oxygen). This air (i.e., the oxygen) contained in the pure water is then mixed into the ultrasonic pure water film 70. As a result, the concentration of the dissolved gas in the ultrasonic pure water film 70 is increased to at most 1 ppm in terms of the DO value.

Figure 6:
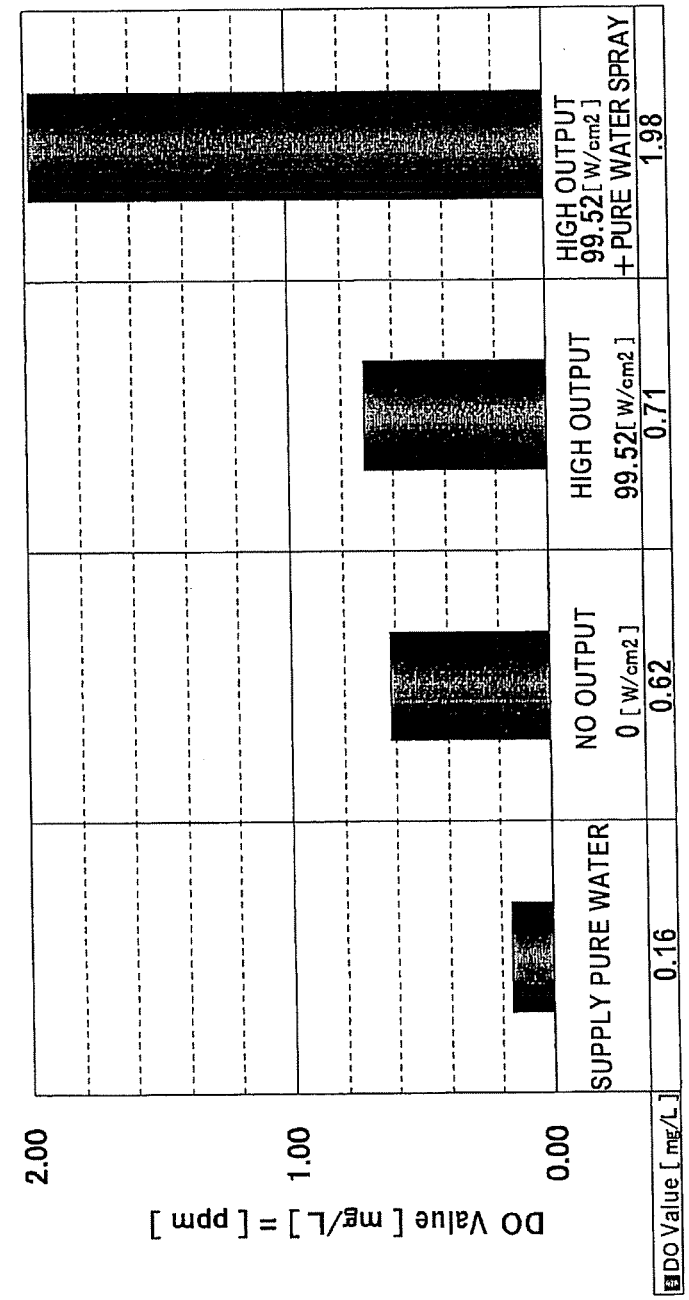
FIG. 6 is a graph showing a DO value ("SUPPLY PURE WATER") of pure water supplied to the ultrasonic cleaning unit and a pure water spray nozzle, a DO value ("NO OUTPUT") of an ultrasonic pure water film when a piezoelectric element of the ultrasonic cleaning unit does not vibrate and the pure water spray nozzle does not spray the pure water, a DO value ("HIGH OUTPUT") of the ultrasonic pure water film when the piezoelectric element of the ultrasonic cleaning unit vibrates at a high power and the pure water spray nozzle does not spray the pure water, and a DO value ("HIGH OUTPUT+PURE WATER SPRAY") of the ultrasonic pure water film when the piezoelectric element of the ultrasonic cleaning unit vibrates at a high power and the pure water spray nozzle sprays the pure water.

FIG. 6 shows measurement results of the DO value (i.e., the concentration of the dissolved gas) of the pure water. The DO value was measured without replacing the interior atmosphere in the chamber 40 with the inert gas atmosphere (e.g., the nitrogen gas atmosphere). In FIG. 6, "SUPPLY PURE WATER" represents the DO value of the pure water supplied to the ultrasonic cleaning unit 52 and the pure water spray nozzle 72, "NO OUTPUT" represents the DO value of the ultrasonic pure water film 70 when the piezoelectric element 64 of the ultrasonic cleaning unit 52 does not vibrate and the pure water spray nozzle 72 does not spray the pure water, "HIGH OUTPUT" represents the DO value of the ultrasonic pure water film 70 when the piezoelectric element 64 of the ultrasonic cleaning unit 52 vibrates at a high power (99.53 $W/cm^2$) and the pure water spray nozzle 72 does not spray the pure water, and "HIGH OUTPUT+PURE WATER SPRAY" represents the DO value of the ultrasonic pure water film 70 when the piezoelectric element 64 of the ultrasonic cleaning unit 52 vibrates at a high power (99.53 $W/cm^2$) and the pure water spray nozzle 72 sprays the pure water.

It can be seen from FIG. 6 that the DO value of the ultrasonic pure water film 70 is increased to about 2.00 ppm when the piezoelectric element 64 of the ultrasonic cleaning unit 52 vibrates at a high power (99.53 $W/cm^2$) and the pure water spray nozzle 72 sprays the pure water.

Figure 7:
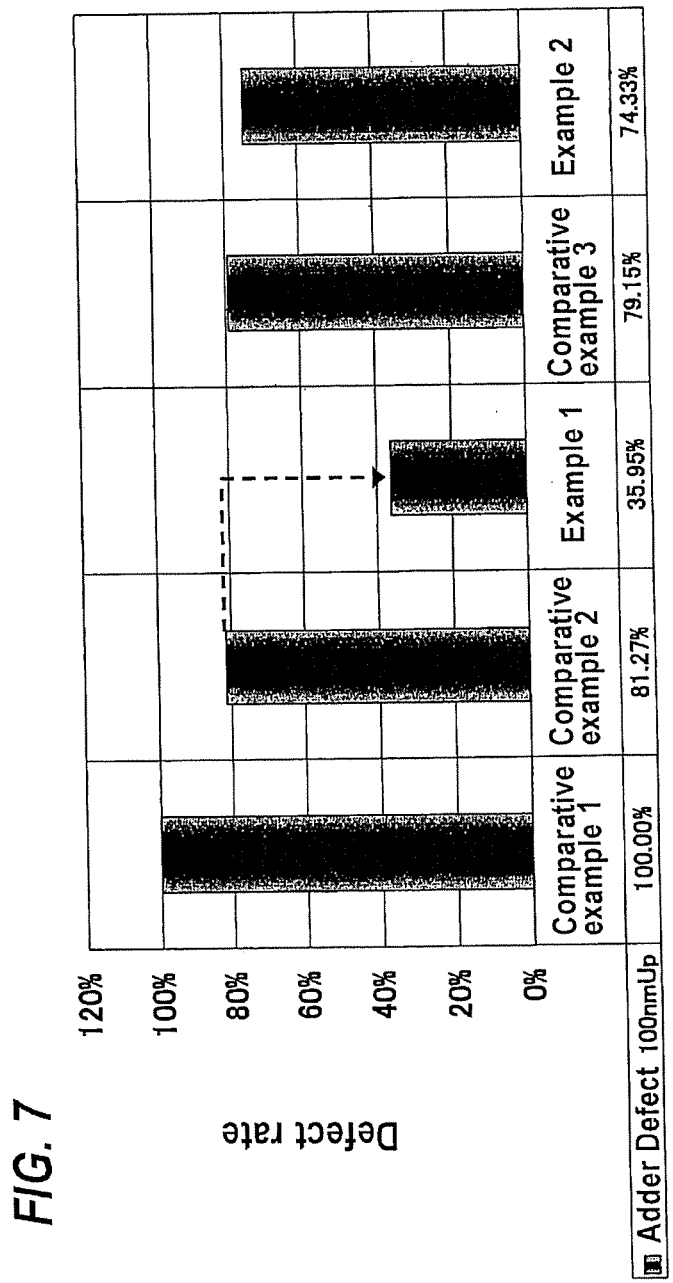
FIG. 7 is a graph showing measurement results of the number of defects having a size of not less than 100 nm remaining after the ultrasonic cleaning process in an example 1, an example 2, and comparative examples 1 to 3, the measurement results being shown by percentage (defect rate) using the defect rate of the comparative example 1 as 100%.

FIG. 7 is a graph showing measurement results of the number of defects having a size of not less than 100 nm and remaining on the substrate after the ultrasonic cleaning process in an example 1 and an example 2 with the use of the second cleaning unit (i.e., the substrate cleaning apparatus) 18. The example 1 shows the measurement result of the number of defects when the ultrasonic cleaning and the spray of the pure water were conducted without replacing the interior atmosphere in the chamber 40 with the inert gas atmosphere (e.g., the nitrogen gas atmosphere). The example 2 shows the measurement result of the number of defects when the angle θ of the jet central axis O with respect to the surface of the substrate W was set to be larger than 30° (θ>30°). Other conditions of the cleaning of the substrate in the example 2 were the same as in the example 1.

FIG. 7 further shows a comparative example 1. This comparative example 1 shows the measurement result of the number of defects on the substrate that has been cleaned without using the ultrasonic cleaning process. Other conditions of the cleaning of the substrate in the comparative example 1 were the same as in the example 1. FIG. 7 further shows a comparative example 2. This comparative example 2 shows the measurement result of the number of defects on the substrate when only the ultrasonic cleaning was performed. Other conditions of the cleaning of the substrate in the comparative example 2 were the same as in the example 1. FIG. 7 further shows a comparative example 3. This comparative example 3 shows the measurement result of the number of defects on the substrate when only the ultrasonic cleaning was performed. Other conditions of the cleaning of the substrate in the comparative example 3 were the same as in the example 2. In FIG. 7, the measurement results are shown by percentage (defect rate) using the number of defects in the comparative example 1 as 100%.

As can be seen from FIG. 7, it is possible to reduce the number of defects having a size of not less than 100 nm in the example 1 and the example 2, as compared with the comparative examples 1, 2, and 3. In particular, the example 1 shows the fact that the number of defects having a size of not less than 100 nm on the cleaned substrate can remarkably be reduced, as compared with the comparative examples 1, 2, 3.

Figure 8:
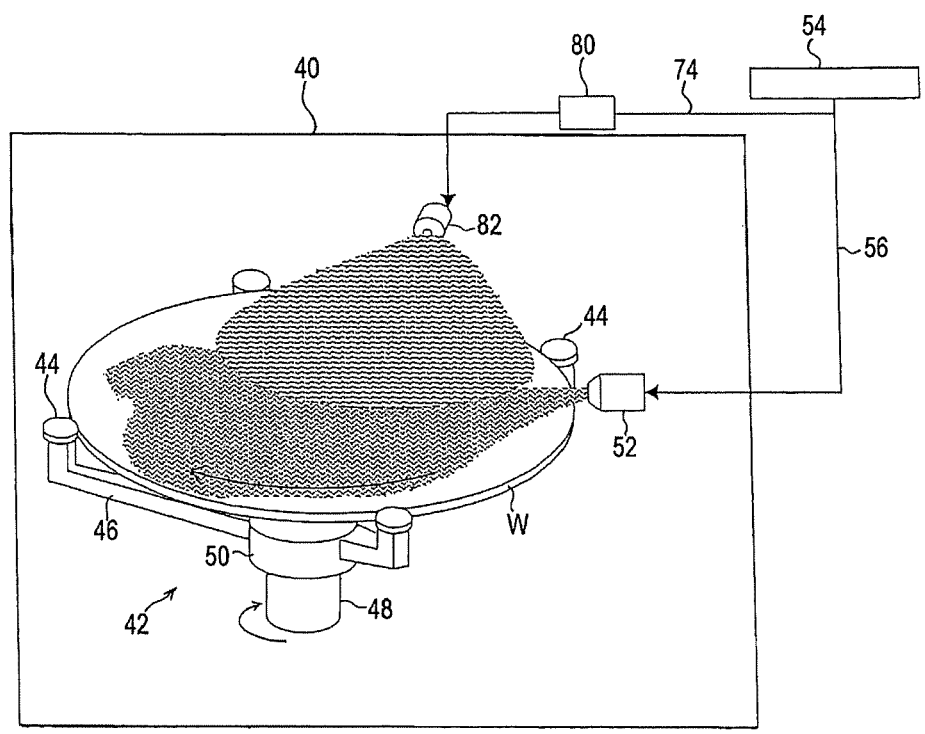
FIG. 8 is a perspective view showing a substrate cleaning apparatus according to another embodiment.

FIG. 8 is a perspective view showing a substrate cleaning apparatus according to another embodiment. This embodiment differs from the above-discussed embodiment in that the chamber 40 is not configured to be able to replace its interior atmosphere with the inert gas atmosphere (e.g., the $N_2$ gas atmosphere), and that the second pure water supply line 74 is provided with a gas dissolving unit 80 for dissolving a gas in the pure water using a permeable membrane or bubbling to thereby produce gas-dissolved pure water having an increased concentration of the gas dissolved in the pure water. Further, instead of the pure water spray nozzle 72, a pure water supply nozzle 82 is provided. The concentration of the dissolved gas in the gas-dissolved pure water produced by the gas dissolving unit 80 may be in a range of 1 to 15 ppm, or may be in a range of 3 to 8 ppm.

The gas to be dissolved in the pure water may be the inert gas, such as $N_2$ gas or argon gas. A gas (e.g., oxygen) in the air existing under a clean room environment may also be used if it does not affect the cleaning of the substrate. A gas, such as carbon dioxide or hydrogen gas, may be dissolved in the pure water to produce functional water, such as carbon dioxide water or hydrogen water. This functional water may be used as the gas-dissolved pure water.

Cleaning of the substrate W is performed as follows. The substrate W is held horizontally and rotated by the chucks 44 of the substrate holder 42. The pure water, to which the ultrasonic vibration energy has been imparted by the ultrasonic cleaning unit 52, is ejected toward the surface of the rotating substrate W to form the ultrasonic pure water film 70 on the surface of the substrate W. The gas-dissolved pure water having the increased concentration of the dissolved gas is produced by the gas dissolving unit 80. With the ultrasonic pure water film 70 formed on the surface of the substrate W, the gas-dissolved pure water having the increased concentration of the dissolved gas is supplied from the pure water supply nozzle 82 to the ultrasonic pure water film 70.

According to this embodiment, the ultrasonic vibration energy is imparted by the ultrasonic cleaning unit 52, while the concentration of the dissolved gas in the ultrasonic pure water film 70 on the surface of the substrate W is increased by the gas-dissolved pure water having the increased concentration of the dissolved gas supplied from the pure water supply nozzle 82. The ultrasonic pure water film 70 having the increased concentration of the dissolved gas is used to clean the surface of the substrate W. In this manner, ultrasonic cleaning of the surface of the substrate W can be performed under the optimal condition that can enable the ultrasonic cleaning to exhibit its full advantages.

Although certain embodiments have been shown and described in detail, it should be understood that various changes and modifications may be made without departing from the scope of the technical concept.

What is claimed is:

1. A substrate cleaning method, comprising:
holding and rotating a substrate;
imparting an ultrasonic vibration energy to deaerated pure water and then supplying the deaerated pure water onto a surface of the substrate to form a film of the deaerated pure water on the surface of the substrate;
spraying a mist of deaerated pure water from at least one spray nozzle into an inert gas atmosphere to incorporate an inert gas into the mist of deaerated pure water; and
supplying the mist of deaerated pure water that has passed through the inert gas atmosphere onto the film of the deaerated pure water to increase a concentration of the inert gas dissolved in the film of the deaerated pure water, thereby cleaning the surface of the substrate with the film of the deaerated pure water having the increased concentration of the inert gas.

2. The substrate cleaning method according to claim 1, wherein the deaerated pure water, to which the ultrasonic vibration energy has been imparted, is supplied at an angle which is larger than 0° and not more than 30° with respect to the surface of the substrate.

3. The substrate cleaning method according to claim 1, wherein the concentration of the inert gas in the film of the deaerated pure water is increased to at least 1 ppm.

4. The substrate cleaning method according to claim 1, wherein the deaerated pure water, to which the ultrasonic vibration energy has been imparted, is supplied from outside a peripheral edge of the substrate.

* * * * *